United States Patent
Zhang et al.

(10) Patent No.: US 12,216,369 B2
(45) Date of Patent: Feb. 4, 2025

(54) DISPLAY PANEL AND DISPLAY APPARATUS

(71) Applicant: BOE Technology Group Co., Ltd., Beijing (CN)

(72) Inventors: Hui Zhang, Beijing (CN); Liwei Liu, Beijing (CN); Kai Hou, Beijing (CN); Changfeng Li, Beijing (CN); Hongrun Wang, Beijing (CN); Shunhang Zhang, Beijing (CN); Yunsik Im, Beijing (CN); Fuqiang Li, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 17/758,122

(22) PCT Filed: Aug. 27, 2021

(86) PCT No.: PCT/CN2021/115100
§ 371 (c)(1),
(2) Date: Jun. 28, 2022

(87) PCT Pub. No.: WO2023/024093
PCT Pub. Date: Mar. 2, 2023

(65) Prior Publication Data
US 2024/0192559 A1 Jun. 13, 2024

(51) Int. Cl.
*G02F 1/1362* (2006.01)
*G02F 1/1333* (2006.01)
(Continued)

(52) U.S. Cl.
CPC .. *G02F 1/136209* (2013.01); *G02F 1/133377* (2013.01); *G02F 1/13394* (2013.01);
(Continued)

(58) Field of Classification Search
None
See application file for complete search history.

(56) References Cited

U.S. PATENT DOCUMENTS

| | | |
|---|---|---|
| 2013/0235294 A1 | 9/2013 | Nomura |
| 2015/0205160 A1 | 7/2015 | Kim et al. |
| (Continued) | | |

FOREIGN PATENT DOCUMENTS

| | | |
|---|---|---|
| CN | 201812117 U | 4/2011 |
| CN | 102654683 A | 9/2012 |
| (Continued) | | |

OTHER PUBLICATIONS

Partial Supplementary European Search Report, mailed May 29, 2024, from European Application No. 21954616.5.

*Primary Examiner* — Dung T Nguyen
(74) *Attorney, Agent, or Firm* — Workman Nydegger

(57) ABSTRACT

A display panel and a display apparatus. The display panel includes: an array substrate, including: scanning lines, data lines and sub-pixels, where at least two sub-pixels adjacent in a first direction and a second direction constitute a pixel island; an opposing substrate; a liquid crystal layer; and supporting parts, including a plurality of first supporting parts and a plurality of second supporting parts. Each supporting part includes: a first sub-supporting part and a second sub-supporting part; orthographic projections of the first sub-supporting parts divide orthographic projections of the second sub-supporting parts into first parts and second parts; and in each supporting part, a length of the first part is not equal to a length of the second part.

18 Claims, 13 Drawing Sheets

(51) Int. Cl.
*G02F 1/1339* (2006.01)
*G02F 1/1368* (2006.01)
*H01L 27/12* (2006.01)

(52) U.S. Cl.
CPC ........ *G02F 1/1368* (2013.01); *H01L 27/1244* (2013.01); *G02F 1/136286* (2013.01)

(56) References Cited

U.S. PATENT DOCUMENTS

| | | | |
|---|---|---|---|
| 2016/0085105 A1* | 3/2016 | Jeon | G02F 1/1337 349/110 |
| 2016/0349561 A1 | 12/2016 | Shiina et al. | |
| 2018/0210277 A1 | 7/2018 | Wang et al. | |
| 2019/0386028 A1 | 12/2019 | Hong | |
| 2020/0341318 A1 | 10/2020 | Kurozumi | |
| 2021/0020755 A1 | 1/2021 | Yan et al. | |
| 2021/0215958 A1 | 7/2021 | Nomura | |
| 2021/0302775 A1* | 9/2021 | Adachi | G02F 1/136286 |

FOREIGN PATENT DOCUMENTS

| | | |
|---|---|---|
| CN | 103309091 A | 9/2013 |
| CN | 105789264 A | 7/2016 |
| CN | 107490917 A | 12/2017 |
| CN | 110262137 A | 9/2019 |
| CN | 111837240 A | 10/2020 |
| JP | 2010014985 A | 1/2010 |
| JP | 2014038125 A | 2/2014 |

\* cited by examiner

26

27

29

22

31

23

33

24

28

24(47)  
28(38)  
22(48)  
29(30)  
31(32)  
25  
33(34)  
27  
23(37)  
26  
27(46)  
50  
51  
52  
23(49)

27

31

23

33

24

41

28

45
43
44

42

DISPLAY PANEL AND DISPLAY APPARATUS

The present application is a National Stage of International Application No. PCT/CN2021/115100, filed on Aug. 27, 2021, which is incorporated in its entirety herein by reference.

FIELD

The present disclosure relates to the field of display technology, in particular to a display panel and a display apparatus.

BACKGROUND

With the continuous development of display technologies, a three-dimensional (3D) display technology has drawn more and more attention. The three-dimensional display technology can make a display image become three-dimensional and realistic. The principle is: a left eye image and a right eye image with a certain parallax are respectively received by left and right eyes of a person. After two images with the parallax are received by the left and right eyes of the person, a brain superimposes and fuses image information to achieve a 3D visual display effect.

In order to achieve compatibility between super multi-view 3D display and light field display, traditional sub pixels are made into a pixel island structure, and each pixel island includes a plurality of sub-pixels. In order to achieve ultra-high resolution display, sizes of the sub-pixels are small. When a sub-pixel pitch in the pixel island structure is smaller, that is, a pixel density (PPI) is higher, the number of viewpoints is larger, the viewing continuity is better, and at the same time, compatibility with light field display is achieved. However, after the PPI increases, a sub-pixel layout is more difficult, and a sub-pixel aperture ratio is low.

SUMMARY

The present disclosure provides a display panel, including: an array substrate, including: a plurality of scanning lines extending in a first direction, a plurality of data lines extending in a second direction, and a plurality of sub-pixels in regions divided by the plurality of scanning lines and the plurality of data lines, wherein the first direction intersects with the second direction, the plurality of sub-pixels include a plurality of sub-pixel rows arranged in the second direction, each of the sub-pixel rows includes a plurality of sub-pixels arranged in the first direction, and at least two sub-pixels adjacent in the first direction and the second direction constitute a pixel island; an opposing substrate opposite to the array substrate; a liquid crystal layer between the array substrate and the opposing substrate; and a plurality of supporting parts between the array substrate and the opposing substrate; wherein an orthographic projection of each of the supporting parts on the array substrate is between orthographic projections of sub-pixel rows adjacent to each other on the array substrate; wherein the supporting part includes a first sub-supporting part and a second sub-supporting part; wherein the first sub-supporting part extends in the first direction, the second sub-supporting part extends in the second direction; wherein one of the first sub-supporting part and the second sub-supporting part is arranged on a surface of a side of the array substrate facing the opposing substrate, and other one of the first sub-supporting part and the second sub-supporting part is arranged on a surface of a side of the opposing substrate facing the array substrate; wherein an orthographic projection of the first sub-supporting part on the array substrate divides an orthographic projection of the second sub-supporting part on the array substrate into a first part and a second part, and in the supporting part, a length of the first part in the second direction is not equal to a length of the second part in the second direction.

In some embodiments, the plurality of supporting parts include: a plurality of first supporting parts and a plurality of second supporting parts.

In each of the first supporting parts, the length of the first part in the second direction is larger than the length of the second part in the second direction.

In each of the second supporting parts, the length of the first part in the second direction is smaller than the length of the second part in the second direction.

In some embodiments, the plurality of sub-pixels in each of the sub-pixel rows are in the same color.

The opposing substrate includes: a light shielding layer. The light shielding layer merely includes a plurality of first light shielding parts extending in the first direction.

Orthographic projections of the first light shielding parts on the array substrate cover orthographic projections of the scanning lines on the array substrate and orthographic projections of the supporting parts on the array substrate.

In some embodiments, the sub-pixel rows include: red sub-pixel rows, blue sub-pixel rows and green sub-pixel rows.

A width of a first light shielding part between each of the red sub-pixel rows and each of the blue sub-pixel rows in the second direction is larger than a width of a first light shielding part between each of the red sub-pixel rows and each of the green sub-pixel rows in the second direction.

The width of the first light shielding part between the red sub-pixel row and the blue sub-pixel row in the second direction is larger than a width of a first light shielding part between the blue sub-pixel row and the green sub-pixel row in the second direction.

In some embodiments, the orthographic projections of the supporting parts on the array substrate are between the adjacent blue sub-pixel rows and red sub-pixel rows.

In some embodiments, in a condition that the plurality of supporting parts include the plurality of first supporting parts and the plurality of second supporting parts, the first supporting parts or the second supporting parts are between the adjacent blue sub-pixel rows and red sub-pixel rows.

In some embodiments, in a condition that the plurality of supporting parts include the plurality of first supporting parts and the plurality of second supporting parts, the first supporting parts and the second supporting parts are between the adjacent blue sub-pixel rows and red sub-pixel rows.

In some embodiments, a length of the first part in the first supporting part in the second direction is equal to a length of the second part in the second supporting part in the second direction.

In some embodiments, a length of the second part in the first supporting part in the second direction is equal to a length of the first part in the second supporting part in the second direction.

In some embodiments, the orthographic projection of the first sub-supporting part on the array substrate is symmetric relative to the orthographic projection of the second sub-supporting part on the array substrate.

In some embodiments, a pattern of the orthographic projection of each supporting part on the array substrate is cross-shaped.

In some embodiments, a width of the first sub-supporting part in the second direction is equal to a width of each second sub-supporting part in the first direction.

In some embodiments, a length of the first sub-supporting part in the first direction is larger than a length of each second sub-supporting part in the second direction.

In some embodiments, the first sub-supporting parts are arranged on the surface of the side of the opposing substrate facing the array substrate.

The second sub-supporting parts are arranged on the surface of the side of the array substrate facing the opposing substrate.

In some embodiments, the array substrate specifically includes: a first base substrate; a first conductive layer on a side of the first base substrate facing the opposing substrate, including: the data lines and first terminals of driving transistors electrically connected to the data lines; a second conductive layer on a side of the first conductive layer away from the first base substrate, including: second terminals of the driving transistors; and a pixel electrode layer on a side of the second conductive layer away from the first conductive layer, including a plurality of pixel electrodes in one-to-one correspondence to the sub-pixels. The pixel electrodes are electrically connected to the second terminals of the driving transistors.

In some embodiments, a minimum distance between an edge of an orthographic projection of the second terminal of each driving transistor on the first base substrate and an edge of an orthographic projection of each data line on the first base substrate is in a range of 0.8 micron to 1 micron.

In some embodiments, the display panel further includes: an active layer between the first base substrate and the first conductive layer, including: a plurality of patterns of the active layer in one-to-one correspondence to the sub-pixels.

A shape of an orthographic projection of each of the patterns of the active layer on the first base substrate has a corner, and at the corner, the orthographic projection of the pattern of the active layer on the first base substrate has a first groove.

In some embodiments, the display panel further includes: a gate conductive layer between the active layer and the first conductive layer, including control terminals of the driving transistors and the scanning lines; a gate insulating layer between the active layer and the gate conductive layer; a first interlayer insulating layer between the gate conductive layer and the first conductive layer; a second interlayer insulating layer between the first conductive layer and the second conductive layer; and a first passivation layer between the second conductive layer and the pixel electrodes.

The second terminal of the driving transistor is in contact with the active layer through a first via hole that penetrates through the second interlayer insulating layer, the first interlayer insulating layer and the gate insulating layer.

Each of the pixel electrodes is in contact with the second terminal of the driving transistor through a second via hole that penetrates through the first passivation layer.

A minimum distance between an edge of an orthographic projection of the second via hole on the first base substrate and an edge of an orthographic projection of the first via hole on the base substrate is larger than or equal to 0.35 micro and smaller than or equal to 0.7 micro.

In some embodiments, a minimum distance between the edge of the orthographic projection of the second via hole on the first base substrate and an edge of an orthographic projection of a control terminal of the driving transistor on the base substrate is larger than or equal to 1 micron and smaller than or equal to 2 microns.

In some embodiments, the display panel further includes: a common electrode layer on a side of the pixel electrode layer away from the second conductive layer, including: common electrodes.

The gate conductive layer further includes: common electrode lines, electrically connected to the common electrode lines, wherein the common electrode lines are arranged between the adjacent blue sub-pixel rows and red sub-pixel rows.

An embodiment of the present disclosure provides a display apparatus, including the display panel provided by the embodiment of the present disclosure.

BRIEF DESCRIPTION OF THE DRAWINGS

In order to describe technical solutions in embodiments of the present disclosure more clearly, the accompanying drawings needed in description of the embodiments are briefly introduced below. Obviously, the drawings in the following description are only some embodiments of the present disclosure. Those ordinarily skilled in the art can further obtain other drawings according to these accompanying drawings without creative work.

DETAILED DESCRIPTION OF THE EMBODIMENTS

Figure 1:
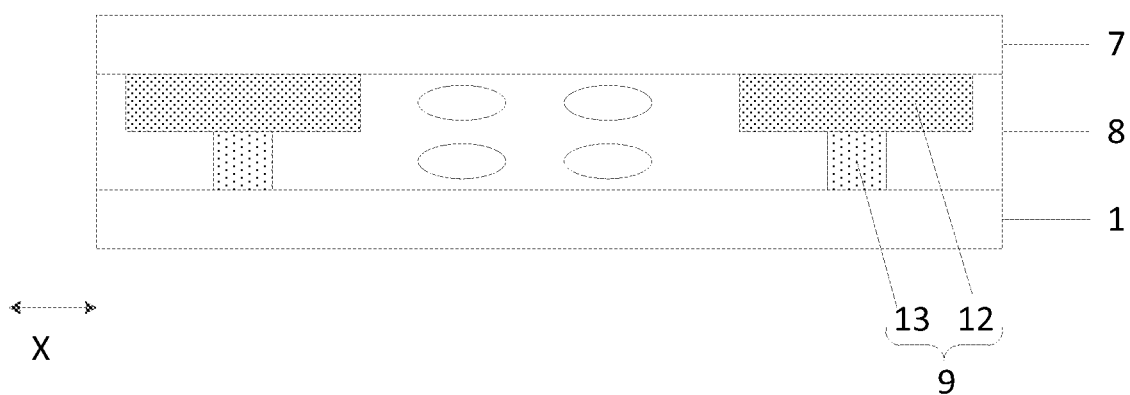
FIG. 1 is a schematic sectional structural diagram of a display panel provided by an embodiment of the present disclosure.

In order to make objectives, technical solutions and advantages of embodiments of the present disclosure clearer, the technical solutions of the embodiments of the present disclosure will be clearly and completely described below with reference to the accompanying drawings of the embodiments of the present disclosure. Obviously, the described embodiments are a part of embodiments of the present disclosure, rather than all the embodiments. Under the condition that no conflict, the embodiments of the present disclosure and the features of the embodiments may be combined with each other. Based on the described embodiments of the present disclosure, all other embodiments obtained by those of ordinary skill in the art without creative efforts fall within the protection scope of the present disclosure.

Unless otherwise defined, technical or scientific terms used in the present disclosure shall have the ordinary meaning as understood by those of ordinary skill in the art to which this present disclosure belongs. "First", "second" and similar words used in the present disclosure do not represent any order, quantity, or importance, but are merely used to distinguish different components. Similar words such as "comprise" or "include" mean that elements or items appearing before the words encompass elements or items recited after the words and their equivalents, but do not exclude other elements or items. Similar words such as "connected" or "linked" are not limited to physical or mechanical connections, but may include electrical connections, whether direct or indirect.

It should be noted that dimensions and shapes of figures in the accompanying drawings do not reflect a real scale, and are only intended to illustrate the contents of the present disclosure. The same or similar reference numerals refer to the same or similar elements or elements having the same or similar functions throughout.

An embodiment of the present disclosure provides a display panel. As shown in FIG. 1, FIG. 2, FIG. 3 and FIG. 4, the display panel includes an array substrate 1, an opposing substrate 7, a liquid crystal layer 8 and a plurality of supporting parts 9.

The array substrate 1 includes a plurality of scanning lines 2 extending in a first direction X, a plurality of data lines 3 extending in a second direction Y, and a plurality of sub-pixels 4 in regions divided by the plurality of scanning lines 2 and the plurality of data lines 3. The first direction X intersects with the second direction Y. At least two sub-pixels adjacent in the first direction X and the second direction Y constitute a pixel island 6. The plurality of sub-pixels 4 include a plurality of sub-pixel rows 5 arranged in the second direction Y, and each sub-pixel row 5 includes a plurality of sub-pixels 4 arranged in the first direction X.

The opposing substrate 7 is arranged opposite to the array substrate 1.

The liquid crystal layer 8 is between the array substrate 1 and the opposing substrate 7.

The plurality of supporting parts 9 is between the array substrate 1 and the opposing substrate 7. An orthographic projection of each supporting part 9 on the array substrate 1 is between orthographic projections of adjacent sub-pixel rows 5 on the array substrate 1. Each supporting part 9 includes: a first sub-supporting part 12 and a second sub-supporting part 13. The first sub-supporting part 12 extends in the first direction X and the second sub-supporting part 13 extends in the second direction Y One of the first sub-supporting part 12 and the second sub-supporting part 13 is arranged on a surface of a side of the array substrate 1 facing the opposing substrate 7, and the other of the first sub-supporting part 12 and the second sub-supporting part 13 is arranged on a surface of a side of the opposing substrate 7 facing the array substrate 1. An orthographic projection of the first sub-supporting part 12 on the array substrate 1 divides an orthographic projection of the second sub-supporting part 13 on the array substrate 1 into a first part 14 and a second part 15. In each supporting part 9, a length of the first part 14 in the second direction Y is not equal to a length of the second part 15 in the second direction Y.

According to the display panel provided by the embodiment of the present disclosure, each supporting part includes the first sub-supporting part and the second sub-supporting part arranged on different substrates and extending in different directions, and the orthographic projection of the first sub-supporting part on the array substrate divides the orthographic projection of the second sub-supporting part on the array substrate into the first part and the second part, i.e. the first sub-supporting part has a certain sliding distance relative to the second sub-supporting part, so a situation that in a display panel manufacturing process, the first sub-supporting part or the second sub-supporting part scratches other film layers due to sliding may be avoided. The length of the first part of the supporting part in the second direction is not equal to the length of the second part of the supporting part in the second direction. In this way, a maximum sliding distance of each supporting part is the sum of a width of the one, of the first part and the second part, with the larger length in the second direction and a width of the corresponding second sub-supporting part in the second direction. Compared with a situation that in each supporting part, the length of the first part in the second direction is equal to the length of the second part in the second direction, the maximum sliding distance of the supporting part may be increased. Therefore, the display panel provided by the embodiment of the present disclosure may reduce a length of a light shielding region of the display panel covering the supporting parts in the second direction under a condition of not changing the sliding distance of the supporting parts, so that an area of a light-transmitting region of a sub-pixel may be improved and an aperture ratio of the sub-pixel is improved, thus further improving a display effect and improving user experience.

Figure 2:
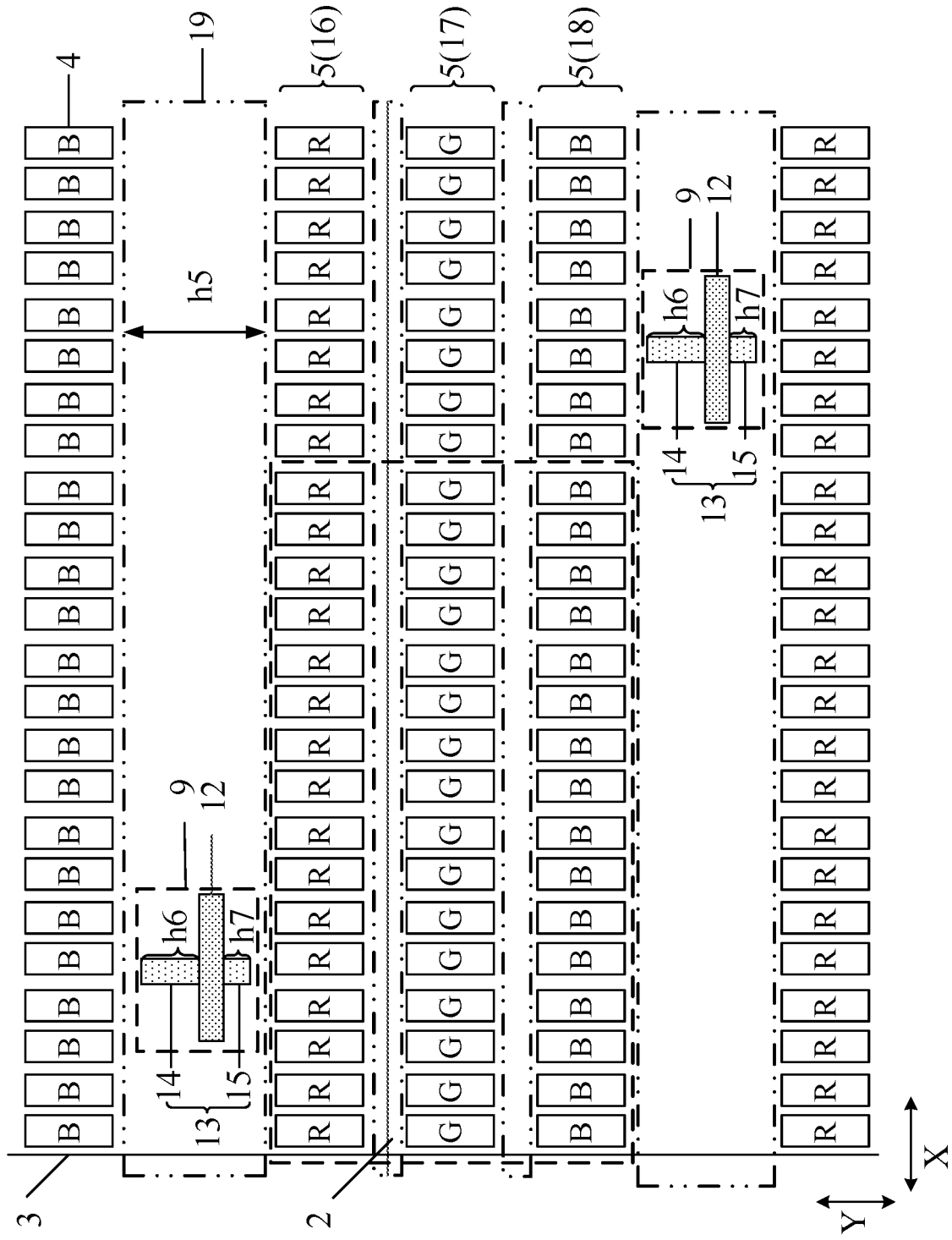
FIG. 2 is a schematic planar structural diagram of an array substrate provided by an embodiment of the present disclosure.
Figure 3:
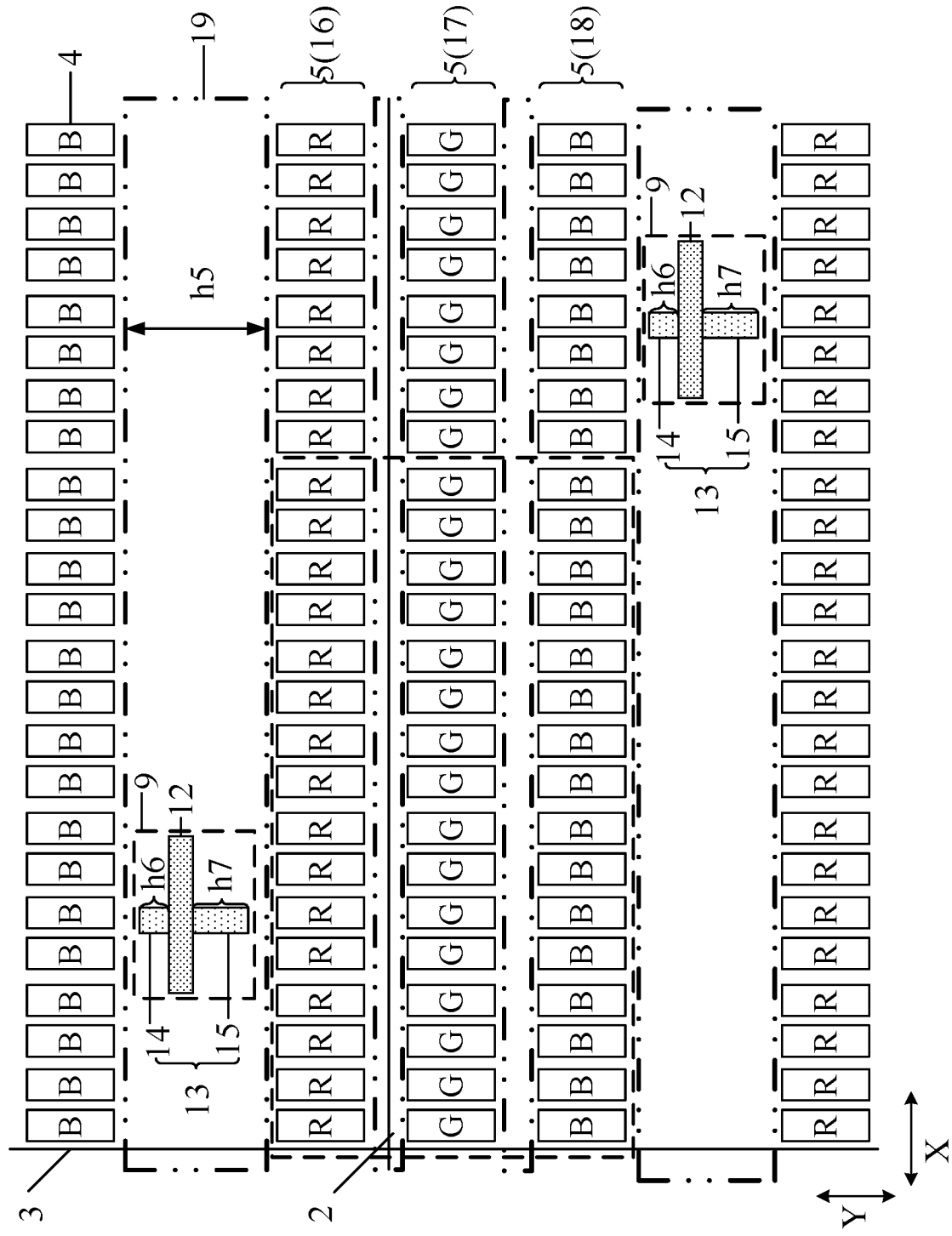
FIG. 3 is a schematic planar structural diagram of another array substrate provided by an embodiment of the present disclosure.
Figure 4:
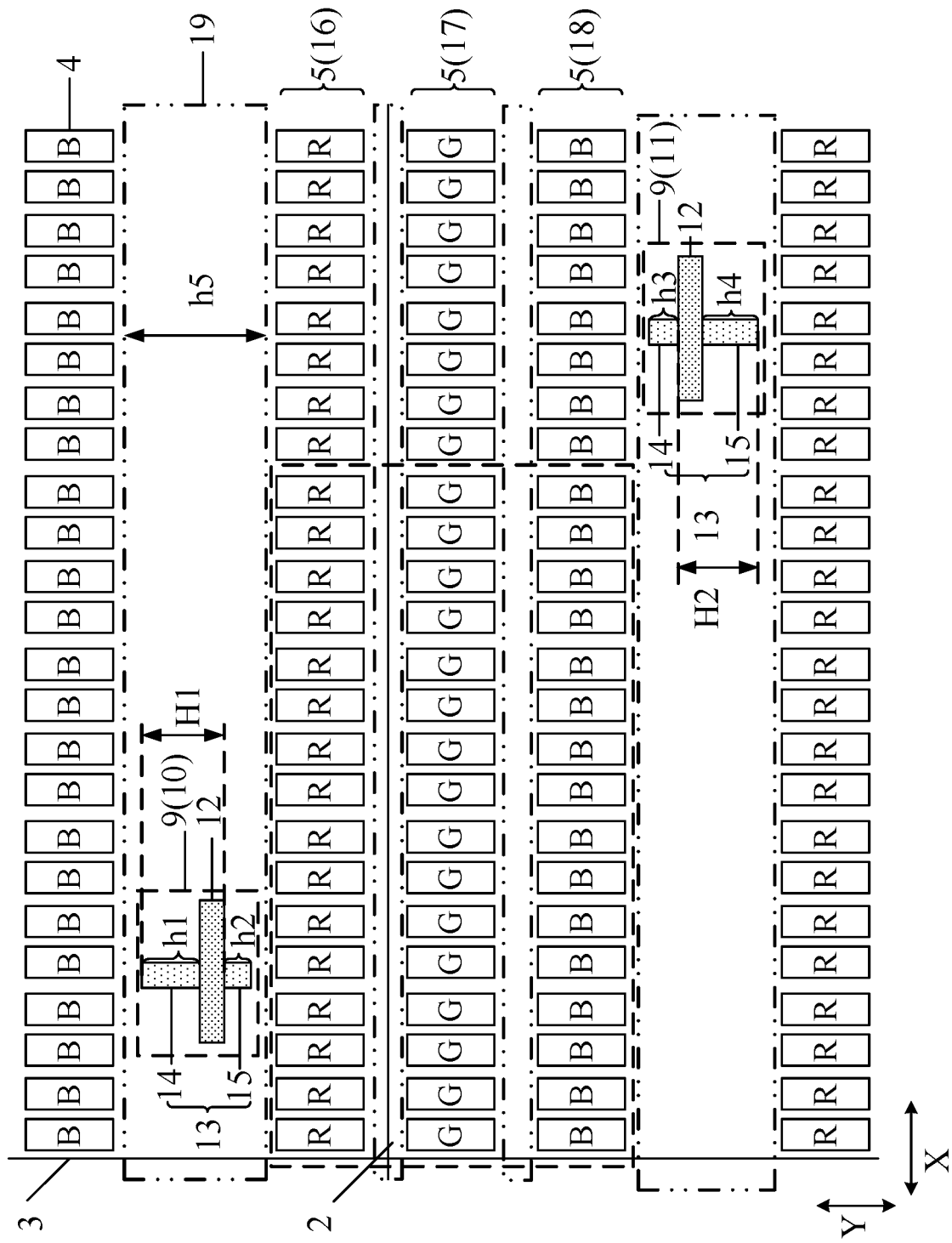
FIG. 4 is a schematic planar structural diagram of yet another array substrate provided by an embodiment of the present disclosure.

It should be noted that, FIG. 2, FIG. 3 and FIG. 4 are planar diagrams of the array substrate, and FIG. 1 may, for example, be a sectional diagram of a partial region of FIG. 2, FIG. 3 and FIG. 4 in the first direction X.

In some embodiments, as shown in FIG. 2 and FIG. 3, the lengths h6 of the first parts 14 in the plurality of supporting parts 9 in the second direction Y are equal; and the lengths h7 of the second parts 15 in the plurality of supporting parts 9 in the second direction Y are equal.

In some embodiments, as shown in FIG. 2, in the plurality of supporting parts 9, the lengths h6 of the first parts 14 in the second direction Y are larger than the lengths h7 of the second parts 15 in the second direction Y.

Or, as shown in FIG. 3, in the plurality of supporting parts 9, the lengths h6 of the first parts 14 in the second direction Y are smaller than the lengths h7 of the second parts 15 in the second direction Y.

In some embodiments, as shown in FIG. 4, the plurality of supporting parts 9 include: a plurality of first supporting parts 10 and a plurality of second supporting parts 11. Each first supporting part 10 includes: a first sub-supporting part 12 and a second sub-supporting part 13; and each second supporting part 11 includes: a first sub-supporting part 12 and a second sub-supporting part 13.

In each first supporting part 10, the length h1 of the first part 14 in the second direction Y is larger than the length h2 of the second part 15 in the second direction Y In each second supporting part 11, the length h3 of the first part 14 in the second direction Y is smaller than the length h4 of the second part 15 in the second direction Y.

According to the display panel provided by the embodiment of the present disclosure, each supporting part includes the first sub-supporting part and the second sub-supporting part arranged on different substrates and extending in different directions, and the orthographic projection of the first sub-supporting part on the array substrate divides the orthographic projection of the second sub-supporting part on the array substrate into the first part and the second part, i.e. the first sub-supporting part has a certain sliding distance relative to the second sub-supporting part, so a situation that in a display panel manufacturing process, the first sub-supporting part or the second sub-supporting part scratches other film layers due to sliding may be avoided. An upward sliding distance of each first supporting part is the sum of a length of the first part in the first supporting part in the second direction and the width of the corresponding second sub-supporting part in the second direction. A downward sliding distance of each second supporting part is the sum of a length of the second part in the second supporting part in the second direction and the width of the corresponding second sub-supporting part in the second direction. Compared with a situation that in each supporting part, the length of the first part in the second direction is equal to the length of the second part in the second direction, the upward sliding distance and downward sliding distance of the supporting part may be increased. In addition, because the display panel includes the two kinds of supporting parts namely the first supporting parts and the second supporting parts, compared with a situation that in each supporting part, the length of the first part in the second direction is equal to the length of the second part in the second direction, a total sliding distance of the supporting parts may be further increased. Therefore, the display panel provided by the embodiment of the present disclosure may reduce the length of the light shielding region of the display panel covering the supporting parts in the second direction under the condition of not changing the sliding distance of the supporting parts, so that an area of a light-transmitting region of a sub-pixel may be improved and an aperture ratio of the sub-pixel is improved, thus further improving the display effect and improving the user experience.

It should be noted that, H1 in FIG. 4 is an upward sliding distance of the first sub-supporting part in each first supporting part, H2 is a downward sliding distance of the first sub-supporting part in each second supporting part, and the total sliding distance of the supporting parts of the display panel is H1+H2. FIG. 4 merely illustrates part of the sub-pixels and supporting parts, and merely illustrates one scanning line and one data line as an example to describe the display panel provided by the embodiment of the present disclosure. During specific implementations, the quantity of the sub-pixels, the quantity of the supporting parts, the quantity of the scanning lines and the quantity of the data lines may be set according to actual needs.

It should be noted that the display panel provided by the embodiment of the present disclosure is a liquid crystal display panel, and may be a Twisted Nematic (TN) type, a Vertical Alignment (VA) type, an In-Plane Switching (IPS) type or an Advanced Super Dimension Switch (ADS) type liquid crystal display panel.

In some embodiments, as shown in FIG. 2, FIG. 3 and FIG. 4, the plurality of sub-pixels 4 in each sub-pixel row 5 are in the same color.

In this way, interference between different viewpoints may be avoided, and moiré may also be alleviated.

In some embodiments, as shown in FIG. 2, FIG. 3 and FIG. 4, the sub-pixel rows 5 include: red sub-pixel rows 16, blue sub-pixel rows 18 and green sub-pixel rows 17. As shown in FIG. 2, FIG. 3 and FIG. 4, each of the red sub-pixel rows 16 includes a plurality of red sub-pixels R arranged in the first direction X, each of the green sub-pixel rows 17 includes a plurality of green sub-pixels G arranged in the first direction X, and each of the blue sub-pixel rows 18 includes a plurality of blue sub-pixels B arranged in the first direction X.

In some embodiments, as shown in FIG. 2, FIG. 3, FIG. 4, and FIG. 5, the opposing substrate includes: a light shielding layer. The light shielding layer merely includes a plurality of first light shielding parts 19 extending in the first direction X.

Orthographic projections of the first light shielding parts 19 on the array substrate cover orthographic projections of the scanning lines 2 on the array substrate and orthographic projections of the supporting parts 9 on the array substrate.

In some embodiments, as shown in FIG. 2, FIG. 3, FIG. 4, and FIG. 5, a width of a first light shielding part 19 between each of the red sub-pixel rows 16 and each of the blue sub-pixel rows 18 in the second direction Y is larger than a width of a first light shielding part 19 between each of the red sub-pixel rows 16 and each of the green sub-pixel rows 17 in the second direction Y.

The width of the first light shielding part 19 between the red sub-pixel row 16 and the blue sub-pixel row 18 in the second direction Y is larger than a width of a first light shielding part 19 between the blue sub-pixel row 18 and the green sub-pixel row 17 in the second direction Y.

It should be noted that, a region defined by a dotted line in FIG. 2, FIG. 3, and FIG. 4 is a region covered by the orthographic projection of each first light shielding part 19 on the array substrate.

It should be noted that a size ratio of the first light shielding parts between the sub-pixel rows in FIG. 2, FIG. 3, FIG. 4, and FIG. 5 does not represent a true ratio, and regions between the blue sub-pixel rows and the red sub-pixel rows are set to be relatively large merely in order to clearly illustrate a structure of the supporting parts.

Figure 5:
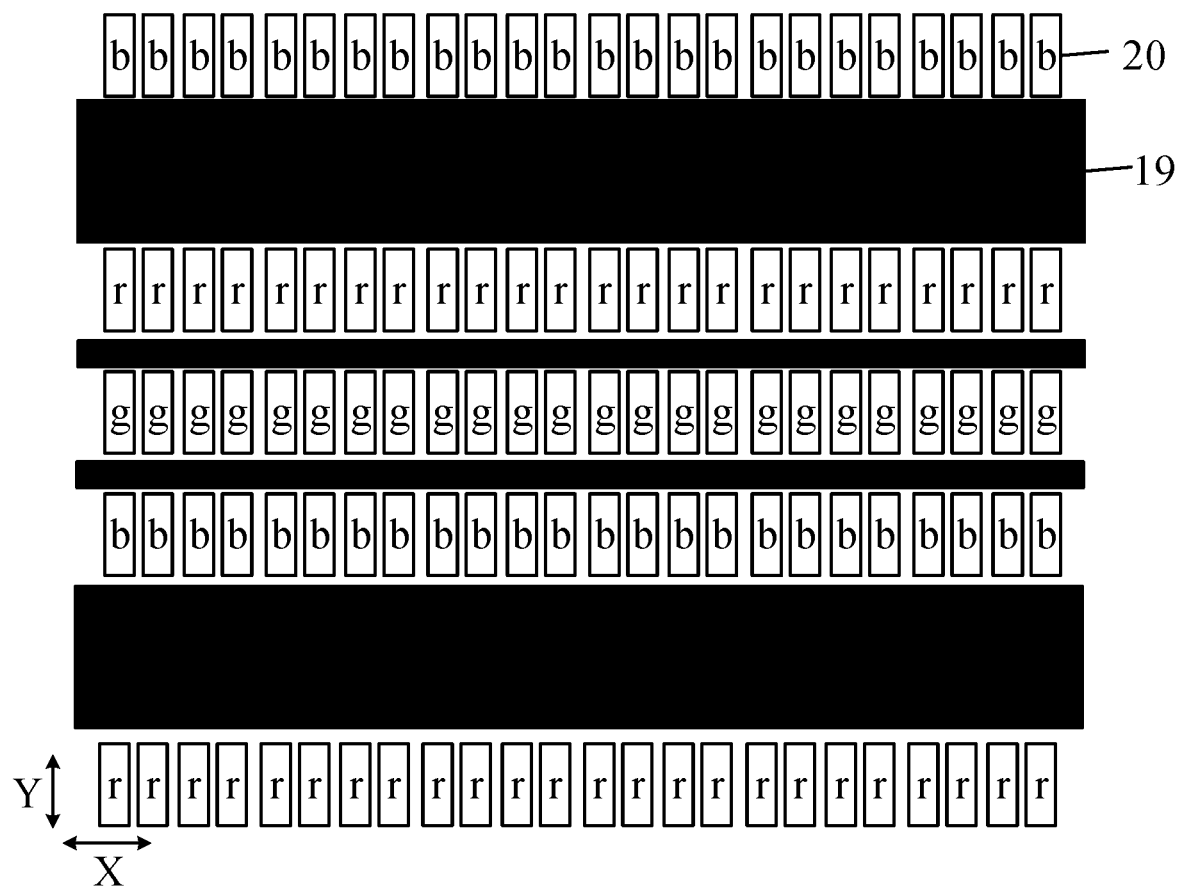
FIG. 5 is a schematic planar structural diagram of an opposing substrate provided by an embodiment of the present disclosure.

It should be noted that, FIG. 5 is a planar diagram of the opposing substrate. As shown in FIG. 5, the opposing substrate further includes color resists 20 arranged in opening regions of the light shielding layer. Colors of the color resists 20 are in one-to-one correspondence to the colors of the sub-pixels, i.e. the color resists 20 include red resists r, blue resists b and green resists g.

It should be noted that, in the related art, a pattern of a light shielding layer of an opposing substrate is grid-shaped, and grid openings are light-transmitting regions of corresponding sub-pixels. According to the display panel provided by the embodiment of the present disclosure, the light shielding layer of the opposing substrate merely includes the first light shielding parts extending in the first direction, i.e. no light shielding part is arranged in the second direction. Compared to the light shielding layer with the grid-shaped pattern in the related art, an aperture ratio of the sub-pixels may be improved. In addition, because a row of sub-pixels extending in the first direction are in the same color, the situation that no light shielding part extending in the second direction is arranged will not cause an influence on the display effect.

In some embodiments, as shown in FIG. 2, FIG. 3, and FIG. 4, orthographic projections of the supporting parts 9 on the array substrate are located between adjacent blue sub-pixel rows 18 and red sub-pixel rows 16.

That is, according to the display panel provided by the embodiment of the present disclosure, the supporting parts are arranged in a region where widths of the first light shielding parts in the second direction Y are relatively large.

It should be noted that, compared with the red sub-pixels and the blue sub-pixels, a light emitting efficiency of the green sub-pixels is affected by the aperture ratio to a greater extent. Therefore, according to the display panel provided by the embodiment of the present disclosure, the region where the widths of the first light shielding parts in the second direction Y are relatively large is arranged between the red sub-pixel row and the blue sub-pixel row, so that influence of the increased widths of the first light shielding parts in the second direction Y on the green sub-pixels may be avoided.

When the plurality of supporting parts include the first supporting parts and the second supporting parts, in some embodiments, as shown in FIG. 4, the first supporting parts 10 or the second supporting parts 11 are located between the adjacent blue sub-pixel rows 18 and red sub-pixel rows 16.

Figure 6:
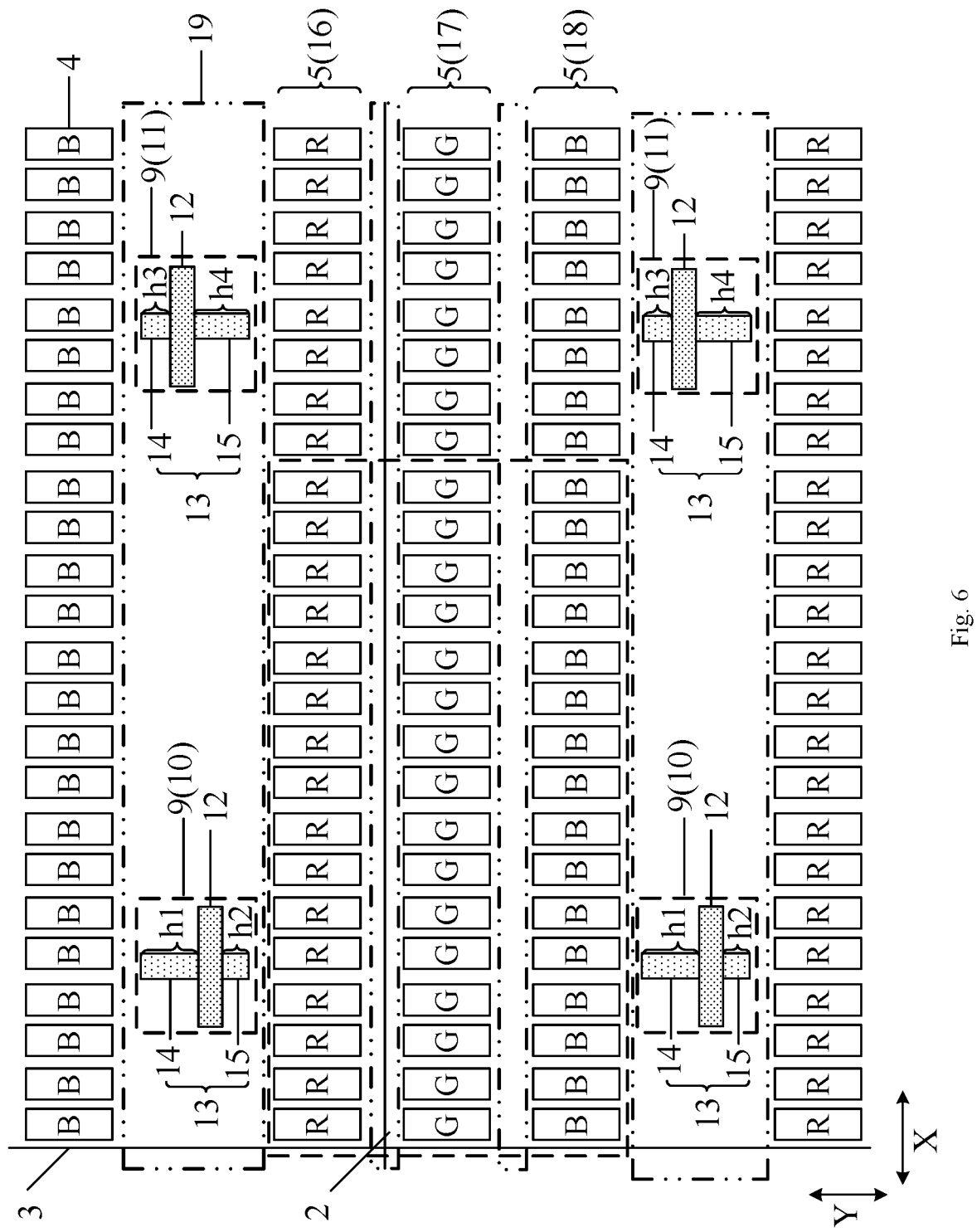
FIG. 6 is a schematic planar structural diagram of another array substrate provided by an embodiment of the present disclosure.

Or, when the plurality of supporting parts include the first supporting parts and the second supporting parts, in some embodiments, as shown in FIG. 6, the first supporting parts 10 and the second supporting parts 11 are located between the adjacent blue sub-pixel rows 18 and red sub-pixel rows 16.

In some embodiments, as shown in FIG. 4 and FIG. 6, a length h1 of the first part 14 in each first supporting part 10 in the second direction Y is equal to a length h4 of the second part 15 in each second supporting part 11 in the second direction Y.

In some embodiments, as shown in FIG. 4 and FIG. 6, a length h2 of the second part 15 in each first supporting part 10 in the second direction Y is equal to a length h3 of the first part 14 in each second supporting part 11 in the second direction Y.

In some embodiments, as shown in FIG. 2, FIG. 3, FIG. 4, and FIG. 6, the orthographic projection the first sub-supporting part 12 on the array substrate is symmetric relative to the orthographic projection the second sub-supporting part 13 on the array substrate.

In some embodiments, as shown in FIG. 2, FIG. 3, FIG. 4, and FIG. 6, a pattern of the orthographic projection of each supporting part 9 on the array substrate is cross-shaped.

It should be noted that, the cross-shaped pattern in the embodiment of the present disclosure refers to: a pattern composed by strip-shaped patterns extending in different directions and vertically intersecting with each other.

As shown in FIG. 2, FIG. 3, FIG. 4, and FIG. 6, the first sub-supporting part and the second sub-supporting part included by the supporting part are strip-shaped patterns extending in different directions, and the first sub-supporting part and the second sub-supporting part vertically intersect with each other to form the cross-shaped pattern.

In some embodiments, as shown in FIG. 2, FIG. 3, FIG. 4, and FIG. 6, a width of each first sub-supporting part 12 in the second direction Y is equal to a width of each second sub-supporting part 13 in the first direction X.

In some embodiments, as shown in FIG. 2, FIG. 3, FIG. 4, and FIG. 6, a length of each first sub-supporting part 12 in the first direction X is larger than a length of each second sub-supporting part 13 in the second direction Y.

In this way, a supporting strength of the supporting parts in the first direction may be improved.

That is, under a condition of unchanged supporting strength of the supporting parts, by using the arrangement mode of the first sub-supporting parts and the second sub-supporting parts provided by the embodiment of the present disclosure, the lengths of the second sub-supporting parts in the second direction may be reduced, so that a width of the first light shielding layer covering the supporting parts in the second direction may be reduced, thus improving the aperture ratio of the sub-pixels.

During specific implementation, the length of each first sub-supporting part in the first direction and the length of each second sub-supporting part in the second direction are 20 microns, and the width of each first sub-supporting part in the second direction and the width of each second sub-supporting part in the first direction are 6 microns. A minimum distance between an edge of each first light shielding part extending in the first direction and the first sub-supporting part may be about 5 microns. The length of the first light shielding part located between the red sub-pixel row and the blue sub-pixel row in the first direction is 44 microns, and a width thereof in the second direction is 10 microns. A minimum distance between the edge of each first light shielding part extending in the first direction and the second sub-supporting part is 3 microns. In each first supporting part, the upward or downward sliding distance of the first sub-supporting part is 12 microns, and in each second supporting part, the downward sliding distance of the first sub-supporting part is 12 microns. That is, the sliding distance of the supporting parts is 24 microns. In actual design, for the sliding distance of the supporting parts, reference should be made to a size of the display panel, magnitude of external force used for product specification testing, and a stress area. For design of sizes of the second sub-supporting parts, the sliding distance of the supporting parts, contact supporting force of the supporting parts, materials of the supporting parts, heights and other factors should be considered. In specific design, when the lengths of the sub-pixels are 52 um, a pixel pitch is 9.75 microns. When a design of the first supporting parts and the second supporting parts provided by the embodiment of the present disclosure is adopted, the width of the first light shielding part in the second direction are 30 microns at most, so it may be ensured that an average aperture ratio of the sub-pixels is larger than 50%.

In some embodiments, as shown in FIG. 1, the first sub-supporting parts 12 are arranged on a surface of a side of the opposing substrate 7 facing the array substrate 1.

The second sub-supporting parts 13 are arranged on a surface of a side of the array substrate 1 facing the opposing substrate 7.

Figure 7:
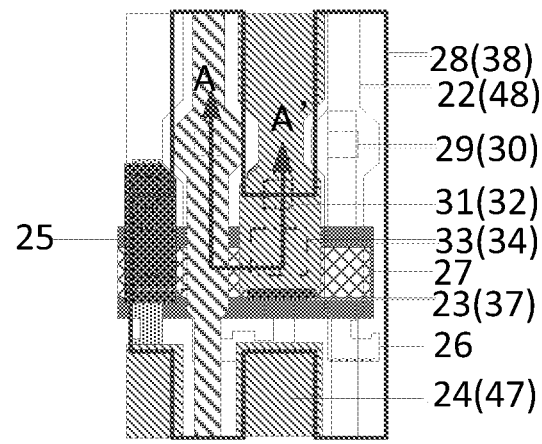
FIG. 7 is a schematic planar structural diagram of yet another array substrate provided by an embodiment of the present disclosure.
Figure 8:
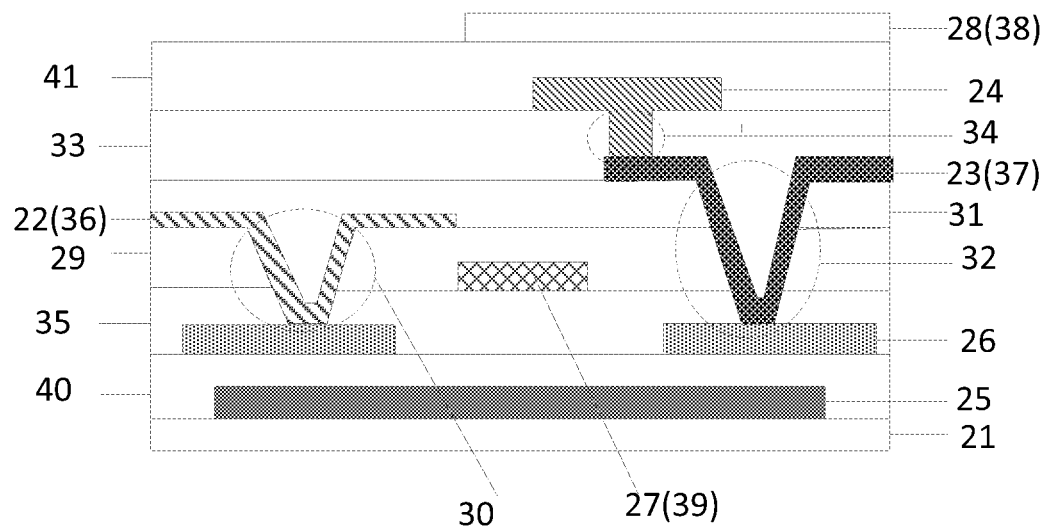
FIG. 8 is a sectional diagram along AA' in FIG. 7 provided by an embodiment of the present disclosure.
Figure 9:
FIG. 9 is a schematic structural diagram of a light shielding layer in an array substrate provided by an embodiment of the present disclosure.

In some embodiments, as shown in FIG. 7 and FIG. 8, the array substrate specifically includes: a first base substrate 21, a first conductive layer 22, a second conductive layer 23 and a pixel electrode layer 24.

The first conductive layer 22 is located on a side of the first base substrate facing the opposing substrate and includes the data lines 48 and first terminals 36 of driving transistors electrically connected to the data lines.

The second conductive layer 23 is on a side of the first conductive layer away from the first base substrate and includes second terminals 37 of the driving transistors.

The pixel electrode layer 24 is located on a side of the second conductive layer away from the first conductive layer and includes a plurality of pixel electrodes 47 in one-to-one correspondence to the sub-pixels. The pixel electrodes are electrically connected to the second poles of the driving transistors.

That is, in the embodiments of the present disclosure, the second terminals of the driving transistors and the data lines are arranged in different conductive layers, so that even a distance between an edge of an orthographic projection of the second terminal of each driving transistor on the first base substrate and an edge of an orthographic projection of the corresponding data line on the first base substrate is reduced, short circuit between the second terminals of the driving transistors and the data lines will not be caused, so a design difficulty of an array substrate layout may be simplified.

It should be noted that, FIG. 8 may, for example, be a sectional diagram along AA' in FIG. 7.

In some embodiments, a width of each scanning line is in a range of 2.5 microns to 3.5 microns. The smaller a resistivity of a material of the gate conductive layer is, the wider the scanning lines may be arranged. The resistivity of the material of the gate conductive layer may be selected to be 0.07 square resistance (Ω/□) to 0.1 (Ω/□).

In some embodiments, a width of each data line is in a range of 1.5 microns to 1.8 microns. In order to prevent broken lines in intersection regions with the scanning lines, a design of compensatory increased width is adopted in the intersection regions with the scanning lines, and the width of each single edge is increased by 0.5 micron.

In some embodiments, a minimum distance between an edge of an orthographic projection of the second terminal of each driving transistor on the first base substrate and an edge of an orthographic projection of each data line on the first base substrate is in a range of 0.8 micron to 1 micron.

In some embodiments, the width of the second terminal of each driving transistor is in a range of 4.3 microns to 6.65 microns.

In some embodiments, as shown in FIG. 7 and FIG. 8, the array substrate further includes an active layer 26. The active layer 26 is located between the first base substrate 21 and the first conductive layer 22 and includes a plurality of patterns of the active layer in one-to-one correspondence to the sub-pixels.

Figure 10:
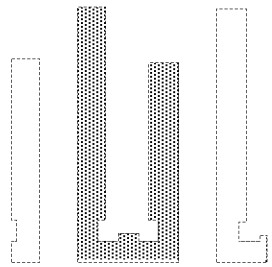
FIG. 10 is a schematic structural diagram of an active layer in an array substrate provided by an embodiment of the present disclosure.
Figure 11:
FIG. 11 is a schematic structural diagram of a gate conductive layer in an array substrate provided by an embodiment of the present disclosure.
Figure 12:
FIG. 12 is a schematic structural diagram of via holes of a first interlayer insulating layer in an array substrate provided by an embodiment of the present disclosure.
Figure 13:
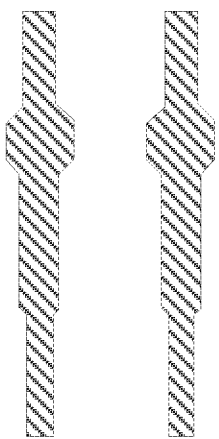
FIG. 13 is a schematic structural diagram of a first conductive layer in an array substrate provided by an embodiment of the present disclosure.
Figure 14:
FIG. 14 is a schematic structural diagram of via holes of a second interlayer insulating layer in an array substrate provided by an embodiment of the present disclosure.
Figure 15:
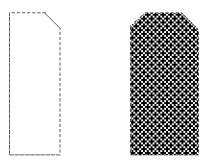
FIG. 15 is a schematic structural diagram of a second conductive layer in an array substrate provided by an embodiment of the present disclosure.
Figure 16:
FIG. 16 is a schematic structural diagram of via holes of a first passivation layer in an array substrate provided by an embodiment of the present disclosure.

As shown in FIG. 10, a shape of an orthographic projection of each pattern of the active layer 26 on the first base substrate is provided with a corner, and at the corner, the orthographic projection of the pattern of the active layer on the first base substrate is provided with a first groove.

In some embodiments, a material of the active layer may, for example, include polycrystalline silicon. The active layer includes a semiconductor region and a conductor region. During specific implementation, for example, a self-alignment process may be used to perform low-temperature doping to form a conductor region. In order to ensure a doping accuracy, a distance between an edge of an orthographic projection of the active layer on the first base substrate and the edge of the orthographic projection of each scanning line on the first base substrate is in a range of 1 micron to 1.5 microns. In order to ensure an accuracy of a corner shape of the active layer, an exposure compensation design needs to be performed at the corner, that is, the corner is hollowed out by 1 micron to form the first groove.

In some embodiments, as shown in FIG. 7 and FIG. 8, the array substrate further includes: the light shielding layer 25 between the active layer 26 and the first base substrate 21; a buffer layer 40 between the light shielding layer 25 and the active layer 26; a gate conductive layer 27 between the active layer 26 and the first conductive layer 22, including control poles 39 of the driving transistors and the scanning lines; a gate insulating layer 35 between the active layer 26 and the gate conductive layer 27; a first interlayer insulating layer 29 between the gate conductive layer 27 and the first conductive layer 22; a second interlayer insulating layer 31 between the first conductive layer 22 and the second conductive layer 23; and a first passivation layer 33 between the second conductive layer 23 and the pixel electrode layer 24.

The second terminal of the driving transistor is in contact with the active layer 26 through first a via hole 32 that penetrates through the second interlayer insulating layer, the first interlayer insulating layer and the gate insulating layer.

The pixel electrode is in contact with the second terminal of the driving transistor through second a via hole 34 that penetrates through the first passivation layer 33.

The first terminal of the driving transistor is in contact with the active layer through a third via hole 30 that penetrates through the first interlayer insulating layer and the gate insulting layer.

It should be noted that, the light shielding layer is configured to shield channel regions of the driving transistors.

In some embodiments, a size of each first via hole is in a range of 1.5 microns to 2.5 microns.

In some embodiments, a size of each second via hole is in a range of 2.5 microns to 3.5 microns.

In some embodiments, a size of each third via hole is in a range of 1.5 microns to 2.5 microns.

In order to avoid etching residue of the via holes, in some embodiments, a minimum distance between an edge of an orthographic projection of each second via hole on the first base substrate and an edge of an orthographic projection of each first via hole on the base substrate is larger than or equal to 0.35 micron and smaller than or equal to 0.7 micron.

In order to avoid the short circuit between the control terminal of the driving transistor and the second terminal of the driving transistor caused by connection between the first via hole and the scanning line, in some embodiments, a minimum distance between the edge of the orthographic projection of the second via hole on the first base substrate and an edge of an orthographic projection of the control terminal of the driving transistor on the first base substrate is larger than or equal to 1 micron and smaller than or equal to 2 microns.

Figure 17:
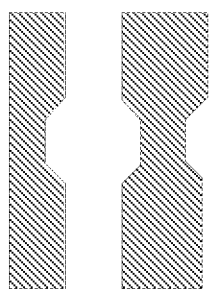
FIG. 17 is a schematic structural diagram of a pixel electrode layer in an array substrate provided by an embodiment of the present disclosure.
Figure 17:
Figure 18:
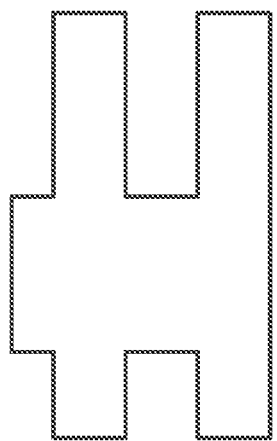
FIG. 18 is a schematic structural diagram of a common electrode layer in an array substrate provided by an embodiment of the present disclosure.

In some embodiments, as shown in FIG. 7 and FIG. 17, the array substrate further includes: a common electrode layer 28 on a side of the pixel electrode layer 24 away from the second conductive layer 23, including: common electrodes 38; and a second passivation layer 41 between the common electrode layer 28 and the pixel electrode layer 24.

Figure 19:
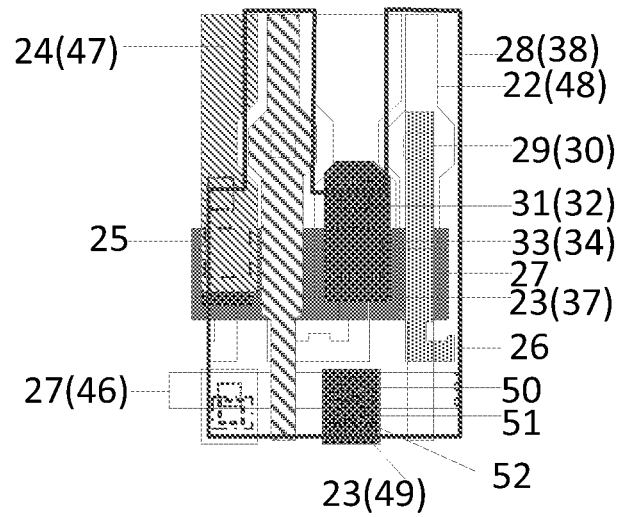
FIG. 19 is a schematic planar structural diagram of another array substrate with a common electrode line region provided by an embodiment of the present disclosure.
Figure 20:
FIG. 20 is a schematic structural diagram of a gate conductive layer corresponding to the region illustrated in FIG. 19 provided by an embodiment of the present disclosure.
Figure 21:
FIG. 21 is a schematic structural diagram of a second interlayer insulating layer corresponding to the region illustrated in FIG. 19 provided by an embodiment of the present disclosure.
Figure 21:
Figure 22:
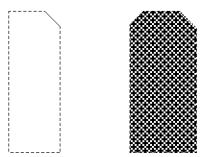
FIG. 22 is a schematic structural diagram of a second conductive layer corresponding to the region illustrated in FIG. 19 provided by an embodiment of the present disclosure.
Figure 22:
Figure 23:
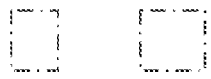
FIG. 23 is a schematic structural diagram of a first passivation layer corresponding to the region illustrated in FIG. 19 provided by an embodiment of the present disclosure.
Figure 23:
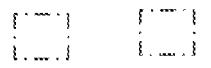
Figure 24:
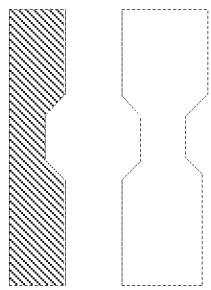
FIG. 24 is a schematic structural diagram of a pixel electrode layer corresponding to the region illustrated in FIG. 19 provided by an embodiment of the present disclosure.
Figure 25:
FIG. 25 is a schematic structural diagram of a second passivation layer corresponding to the region illustrated in FIG. 19 provided by an embodiment of the present disclosure.
Figure 26:
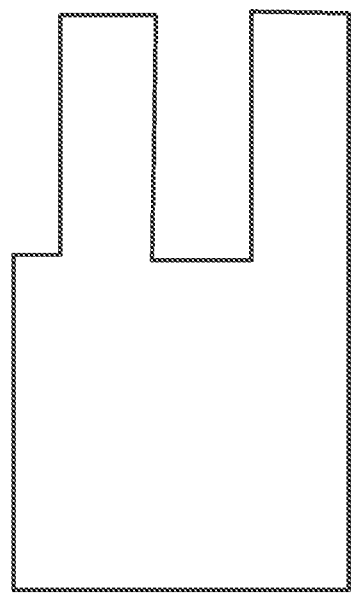
FIG. 26 is a schematic structural diagram of a common electrode layer corresponding to the region illustrated in FIG. 19 provided by an embodiment of the present disclosure.

In some embodiments, as shown in FIG. 19, the gate conductive layer 27 further includes: common electrode lines 46 electrically connected to the common electrodes 38. The common electrode lines are arranged between adjacent blue sub-pixel rows and red sub-pixel rows.

During specific implementation, for example, the common electrode lines may be arranged in regions corresponding to the supporting parts between the blue sub-pixel rows and the red sub-pixel rows, so that an influence caused by the arrangement of the common electrode lines on the aperture ratio of the display panel may be avoided.

In some embodiments, the second conductive layer 23 further includes connecting electrodes 49. Each of the connecting electrodes 49 is electrically connected to the common electrode line 46 through a fourth via hole 50 that penetrates through the second interlayer insulating layer and the first interlayer insulating layer. The common electrode 38 is electrically connected with the connecting electrode 49 through a fifth via holes 52 that penetrates through the second passivation layer and a sixth via hole 51 that penetrates through the first passivation layer. Orthographic projections of the fourth via hole, the fifth via hole and the sixth via hole on the first base substrate overlap with one another.

It should be noted that, the pixel electrode layer and the common electrode layer may adopt materials with a relatively high transmittance. For example, the pixel electrode layer and the common electrode layer may include indium tin oxide (ITO). That is, two ITO layers may be arranged in the array substrate. The first ITO layer serves as the pixel electrode layer, so that the quantity of via holes may be reduced, thus improving the aperture ratio.

During specific implementation, the pixel pitch may, for example, designed to be 9.75 microns. Under this condition, ITO with the highest transmittance may be used, so that a width to length ratio at a notch of the common electrode is 4.8 microns/4.95 microns, i.e. the common electrode arranged into an entire layer are hollowed out by 4.8 microns in a light light-transmitting region of pixels.

It should be noted that, FIG. 9 to FIG. 18 are patterns of the light shielding layer 25, the active layer 26, the gate conductive layer 27, the first interlayer insulating layer 29, the first conductive layer 22, the second interlayer insulating layer 31, the second conductive layer 23, the first passivation layer 33, the pixel electrode layer 24 and the common electrode layer 28 corresponding to the region illustrated in FIG. 7. FIG. 20 to FIG. 27 are patterns of the gate conductive layer 27, the second interlayer insulating layer 31, the second conductive layer 23, the first passivation layer 33, the pixel electrode layer 24, the second passivation layer 41 and the common electrode layer 28 corresponding to the region shown in FIG. 19. Among them, FIG. 12, FIG. 14, FIG. 16, FIG. 21, FIG. 23, and FIG. 25 respectively merely show the pattern of each via hole in each insulating layer. Reference should be made to FIG. 10 for the pattern of the active layer corresponding to FIG. 19, and reference should be made to FIG. 13 for the pattern of the first conductive layer 22 corresponding to FIG. 19.

Next, to take second sub-supporting parts prepared on a side of an array substrate facing an opposing substrate as an example, preparation of the array substrate in the display panel provided by the embodiment of the present disclosure is described by examples. A preparation method of the array substrate includes the following steps.

S101, a light shielding layer material is deposited on a first base substrate, and a pattern of a light shielding layer is formed by using a patterning process.

S102, a buffer layer material is deposited to form a buffer layer.

S103, a semiconductor material is deposited and a pattern of an active layer is formed through etching.

S104, a gate insulating layer material is deposited to form a gate insulating layer.

S105, a gate metal material is deposited and a pattern of a gate metal layer is formed through etching, and a conductor region is formed on the active layer by using a semiconductor self-alignment doping process.

S106, a first interlayer insulating layer material is deposited and a third via hole is formed through etching.

S107, a metal material is deposited to form a first conductive layer, and a pattern of the first conductive layer is formed through etching.

S108, a second interlayer insulating layer material is deposited and a first via hole is formed through etching.

S109, a metal material is deposited to form a second conductive layer, and a pattern of the second conductive layer is formed through etching.

S110, a first passivation layer material is deposited to form a first passivation layer, and a second via hole is formed by using an exposure process.

S111, ITO is deposited to form a pixel electrode layer, and a pixel electrode is formed through etching.

S112, a second passivation layer material is deposited to form a second passivation layer, and a via hole in a surrounding region is formed through etching.

S113, ITO is deposited to form a common electrode layer, and a pattern the common electrode is formed through etching.

S114, a second sub-supporting part material is deposited, and a pattern of a second sub-supporting part is formed through etching.

Figure 27:
FIG. 27 is a schematic structural diagram of a display apparatus provided by an embodiment of the present disclosure.

An embodiment of the present disclosure provides a display apparatus, as shown in FIG. 27, including the display panel 42 provided by the embodiment of the present disclosure.

In some embodiments, as shown in FIG. 27, the display apparatus further includes: a cylindrical lens structure 43 on a light emitting side of the display panel. The cylindrical lens structure includes a plurality of cylindrical lens arranged in an array.

In some embodiments, as shown in FIG. 27, the display apparatus further includes: a light-transmitting spacer layer 44 between the display panel 42 and the cylindrical lens structure 43; and a flat layer 45, located on a side of the cylindrical lens structure 43 away from the light-transmitting spacer layer 44.

In some embodiments, when the display panel is a liquid crystal display panel, for example, the display apparatus further includes a backlight module located on the display panel away from the cylindrical lens structure.

In some embodiments, the display apparatus further includes: an eye-tracking system, configured to determine a gaze region of a user's eyes on the display apparatus in real time.

In this way, display information of each sub-pixel in a pixel island corresponding to the gaze region may be determined according to the gaze region of the user's eyes on the display apparatus.

During specific implementation, due to sub-pixel subdivision carried out in the pixel island (a sub pixel that can be displayed as a two-dimensional image (2D)), in a three-dimensional image (3D) display mode, the same resolution as the 2D display can be maintained. Combined with eye-tracking, multi-view display with large viewing angle can be realized, and 3D display with higher pixel density (ppi) can be achieved, thus realizing larger information volume and lower color crosstalk between adjacent viewpoints. Dizziness of a user when viewing a 3D image can also be reduced, so user experience can be improved. When the display apparatus is provided with a cylindrical lens array, the cylindrical lens array may not only perform pixel mapping on the sub-pixels in the pixel island, but also perform light field modulation on emergent light from the pixel island, so that final emergent light from the pixel island can form multiple view point, so as to realize light field 3D display.

The display apparatus provided by the embodiment of the present disclosure is: a mobile phone, a tablet computer, a television, a monitor, a notebook computer, a digital photo frame, a navigator and other product or component with a display function. Other essential components of the display apparatus should be understood by those of ordinary skill in the art, and will not be described in detail here, nor should it be regarded as a limitation to the present disclosure. For implementation of the display apparatus, reference may be made to the above-mentioned embodiment of the display panel, and repeated descriptions will not be made here.

In conclusion, the display panel provided by the embodiment of the present disclosure is the display apparatus, each supporting part includes the first sub-supporting part and the second sub-supporting part arranged on different substrates and extending in different directions, and the orthographic projection of the first sub-supporting part on the array substrate divides the orthographic projection of the second sub-supporting part on the array substrate into the first part and the second part, i.e. the first sub-supporting part has a certain sliding distance relative to the second sub-supporting part, so a situation that in a display panel manufacturing process, the first sub-supporting part or the second sub-supporting part scratches other film layers due to sliding may be avoided. An upward sliding distance of each first supporting part is the sum of a length of the first part in the first supporting part in the second direction and the width of the corresponding second sub-supporting part in the second direction. A downward sliding distance of each second supporting part is the sum of a length of the second part in the second supporting part in the second direction and the width of the corresponding second sub-supporting part in the second direction. Compared with a situation that in each supporting part, the length of the first part in the second direction is equal to the length of the second part in the second direction, the upward sliding distance and downward sliding distance of the supporting part may be increased. In addition, because the display panel includes the two kinds of supporting parts namely the first supporting parts and the second supporting parts, compared with a situation that in each supporting part, the length of the first part in the second direction is equal to the length of the second part in the second direction, a total sliding distance of the supporting parts may be further increased. Therefore, the display panel provided by the embodiment of the present disclosure may reduce the length of the light shielding region of the display panel covering the supporting parts in the second direction under the condition of not changing the sliding distance of the supporting parts, so that an area of a light-transmitting region of a sub-pixel may be improved and an aperture ratio of the sub-pixel is improved, thus further improving the display effect and improving the user experience.

While preferred embodiments of the present disclosure have been described, additional changes and modifications to these embodiments may be made by those of skill in the art once they are aware of basic inventive concepts. Therefore, appended claims are intended to be construed to include the preferred embodiments and all changes and modifications that fall within the scope of the present disclosure.

Obviously, those of skill in the art can make various changes and modifications to the embodiments of the present disclosure without departing from the spirit and scope of the embodiments of the present disclosure. Thus, provided that these changes and modifications of the embodiments of the present disclosure fall within the scope of the claims of the present disclosure and their equivalents, the present disclosure is also intended to cover such changes and modifications.

What is claimed is:

1. A display panel, comprising:
   an array substrate, comprising: a plurality of scanning lines extending in a first direction, a plurality of data lines extending in a second direction, and a plurality of sub-pixels in regions divided by the plurality of scanning lines and the plurality of data lines, wherein the first direction intersects with the second direction, the plurality of sub-pixels comprise a plurality of sub-pixel rows arranged in the second direction, each of the sub-pixel rows comprises a plurality of sub-pixels arranged in the first direction, and at least two sub-pixels adjacent in the first direction and the second direction constitute a pixel island;
   an opposing substrate opposite to the array substrate;
   a liquid crystal layer between the array substrate and the opposing substrate; and
   a plurality of supporting parts between the array substrate and the opposing substrate;
   wherein an orthographic projection of each of the supporting parts on the array substrate is between orthographic projections of sub-pixel rows adjacent to each other on the array substrate; wherein the supporting part comprises a first sub-supporting part and a second sub-supporting part; wherein the first sub-supporting part extends in the first direction, the second sub-supporting part extends in the second direction; wherein one of the first sub-supporting part and the second sub-supporting part is arranged on a surface of a side of the array substrate facing the opposing substrate, and other one of the first sub-supporting part and the second sub-supporting part is arranged on a surface of a side of the opposing substrate facing the array substrate; wherein an orthographic projection of the first sub-supporting part on the array substrate divides an orthographic projection of the second sub-supporting part on the array substrate into a first part and a second part, and in the supporting part, a length of the first part in the second direction is not equal to a length of the second part in the second direction;

wherein the plurality of sub-pixels in each of the sub-pixel rows are in the same color; the opposing substrate comprises: a light shielding layer, wherein the light shielding layer comprises a plurality of first light shielding parts extending in the first direction; and orthographic projections of the first light shielding parts on the array substrate cover orthographic projections of the scanning lines on the array substrate and orthographic projections of the supporting parts on the array substrate;

the sub-pixel rows comprise: red sub-pixel rows, blue sub-pixel rows and green sub-pixel rows; a width of a first light shielding part between each of the red sub-pixel rows and each of the blue sub-pixel rows in the second direction is larger than a width of a first light shielding part between each of the red sub-pixel rows and each of the green sub-pixel rows in the second direction; and the width of the first light shielding part between the red sub-pixel row and the blue sub-pixel row in the second direction is larger than a width of a first light shielding part between the blue sub-pixel row and the green sub-pixel row in the second direction.

2. The display panel according to claim 1, wherein the plurality of supporting parts comprise: a plurality of first supporting parts and a plurality of second supporting parts;
in each of the first supporting parts, the length of the first part in the second direction is larger than the length of the second part in the second direction; and
in each of the second supporting parts, the length of the first part in the second direction is smaller than the length of the second part in the second direction.

3. The display panel according to claim 2, wherein a length of the first part in the first supporting part in the second direction is equal to a length of the second part in the second supporting part in the second direction.

4. The display panel according to claim 3, wherein a length of the second part in the first supporting part in the second direction is equal to a length of the first part in the second supporting part in the second direction.

5. The display panel according to claim 1, wherein the orthographic projections of the supporting parts on the array substrate are between the adjacent blue sub-pixel rows and red sub-pixel rows.

6. The display panel according to claim 5, wherein in a condition that the plurality of supporting parts comprise the plurality of first supporting parts and the plurality of second supporting parts, the first supporting parts or the second supporting parts are between the adjacent blue sub-pixel rows and red sub-pixel rows.

7. The display panel according to claim 5, wherein in a condition that the plurality of supporting parts comprise the plurality of first supporting parts and the plurality of second supporting parts, the first supporting parts and the second supporting parts are between the adjacent blue sub-pixel rows and red sub-pixel rows.

8. The display panel according to claim 1, wherein the orthographic projection of the first sub-supporting part on the array substrate is symmetric relative to the orthographic projection of the second sub-supporting part on the array substrate.

9. The display panel according to claim 8, wherein a pattern of the orthographic projection of each supporting part on the array substrate is cross-shaped.

10. The display panel according to claim 1, wherein a width of the first sub-supporting part in the second direction is equal to a width of each second sub-supporting part in the first direction.

11. The display panel according to claim 1, wherein a length of the first sub-supporting part in the first direction is larger than a length of each second sub-supporting part in the second direction.

12. The display panel according to claim 1, wherein the first sub-supporting parts are arranged on a surface of the side of the opposing substrate facing the array substrate; and
the second sub-supporting parts are arranged on a surface of the side of the array substrate facing the opposing substrate.

13. The display panel according to claim 1, wherein the array substrate comprises:
a first base substrate;
a first conductive layer on a side of the first base substrate facing the opposing substrate, comprising: the data lines and first terminals of driving transistors electrically connected to the data lines;
a second conductive layer on a side of the first conductive layer away from the first base substrate, comprising: second terminals of the driving transistors; and
a pixel electrode layer on a side of the second conductive layer away from the first conductive layer, comprising a plurality of pixel electrodes in one-to-one correspondence to the sub-pixels, wherein the pixel electrodes are electrically connected to the second terminals of the driving transistors.

14. The display panel according to claim 13, wherein a minimum distance between an edge of an orthographic projection of the second terminal of each driving transistor on the first base substrate and an edge of an orthographic projection of each data line on the first base substrate is in a range of 0.8 micron to 1 micron.

15. The display panel according to claim 14, further comprising:
a gate conductive layer between the active layer and the first conductive layer and comprising control terminals of the driving transistors and the scanning lines;
a gate insulating layer between the active layer and the gate conductive layer;
a first interlayer insulating layer between the gate conductive layer and the first conductive layer;
a second interlayer insulating layer between the first conductive layer and the second conductive layer; and
a first passivation layer between the second conductive layer and the pixel electrodes;
wherein the second terminal of the driving transistor is in contact with the active layer through a first via hole that penetrates through the second interlayer insulating layer, the first interlayer insulating layer and the gate insulating layer;

each of the pixel electrodes is in contact with the second terminal of the driving transistor through a second via hole that penetrates through the first passivation layer; and a minimum distance between an edge of an orthographic projection of the second via hole on the first base substrate and an edge of an orthographic projection of the first via hole on the base substrate is larger than or equal to 0.35 micron and smaller than or equal to 0.7 micron.

16. The display panel according to claim 15, wherein a minimum distance between an edge of an orthographic projection of the second via hole on the first base substrate and an edge of an orthographic projection of a control terminal of the driving transistor on the base substrate is larger than or equal to 1 micron and smaller than or equal to 2 microns.

17. The display panel according to claim 13, further comprising:

an active layer between the first base substrate and the first conductive layer, comprising a plurality of patterns of the active layer in one-to-one correspondence to the sub-pixels;

wherein a shape of an orthographic projection of each of the patterns of the active layer on the first base substrate is provided with a corner, and at the corner, the orthographic projection of the pattern of the active layer on the first base substrate is provided with a first groove.

18. A display apparatus, comprising the display panel according to claim 1.

* * * * *